United States Patent
Motz

(10) Patent No.: US 7,961,041 B2
(45) Date of Patent: Jun. 14, 2011

(54) SYSTEM AND METHOD FOR GENERATING A REFERENCE VOLTAGE

(75) Inventor: Mario Motz, Wernberg (AT)

(73) Assignee: Infineon Technologies AG, Neubiberg (DE)

( * ) Notice: Subject to any disclaimer, the term of this patent is extended or adjusted under 35 U.S.C. 154(b) by 606 days.

(21) Appl. No.: 12/121,342

(22) Filed: May 15, 2008

(65) Prior Publication Data
US 2009/0284242 A1    Nov. 19, 2009

(51) Int. Cl.
*H03F 1/02* (2006.01)
*H03F 3/45* (2006.01)

(52) U.S. Cl. .............................. 330/9; 330/258; 330/257

(58) Field of Classification Search ............. 330/9, 258, 330/257
See application file for complete search history.

(56) References Cited

U.S. PATENT DOCUMENTS

| | | | | |
|---|---|---|---|---|
| 5,019,788 A | * | 5/1991 | Fischer et al. | 330/9 |
| 5,206,602 A | * | 4/1993 | Baumgartner et al. | 330/9 |
| 6,034,568 A | * | 3/2000 | Bonaccio et al. | 330/253 |
| 6,259,313 B1 | * | 7/2001 | Lewicki | 327/563 |
| 6,538,503 B2 | * | 3/2003 | Burt | 330/9 |
| 2006/0279353 A1 | * | 12/2006 | Atrash et al. | 330/9 |
| 2007/0013438 A1 | * | 1/2007 | Chuang | 330/9 |
| 2008/0204138 A1 | * | 8/2008 | Yang et al. | 330/258 |

OTHER PUBLICATIONS

Jiang, Y., et al., "A Low Voltage Low 1/f Noise CMOS Bandgap Reference," IEEE, 2005, pp. 3877-3880.
Lian-Xi, L., et al., "A High Accuracy Bandgap Reference with Chopped Modulator to Compensate MOSFET Mismatch," IEEE Proceedings of the 18th International Conference on VLSI Design held jointly with the 4th International Conference on Embedded Systems Design (VLSID'05), 2005, 4 pages.
Sanduleanu, M.A.T., et al., "Accurate low power bandgap voltage reference in 0.5mm CMOS technology," Electronic Letters, May 14, 1998, vol. 34 No. 10, p. 1025.

* cited by examiner

*Primary Examiner* — Bao Q Vu
(74) *Attorney, Agent, or Firm* — Slater & Matsil, L.L.P.

(57) ABSTRACT

In one embodiment, a circuit having a chopper stabilized amplifier and a network coupled in feedback with the chopper stabilized amplifier is disclosed. The circuit also has a plurality of switches coupled to an output of the chopper stabilized amplifier, and a summing network coupled to the plurality of switches. Ones of the plurality of switches are coupled to ones of a plurality of the summing network inputs.

25 Claims, 5 Drawing Sheets

SYSTEM AND METHOD FOR GENERATING A REFERENCE VOLTAGE

TECHNICAL FIELD

This invention relates generally to semiconductor circuits, and more particularly to a method for generating a reference voltage.

BACKGROUND

Semiconductor devices are used in a wide variety of applications, for example, in cellular phones and personal computers. The high demand for portable devices as well as advances in semiconductor process has created new state of the art processes that must be operated at low power supply voltages.

As semiconductor feature sizes get smaller and smaller, the voltage level that these devices can withstand has decreased correspondingly. Thinner gate oxides and shorter channel lengths have reduced common supply voltages from the 5V and 3.3V seen a decade ago to 1.2V and below. The higher device density and faster performance of submicron processes have come at a cost of lower device breakdown voltages. High demand for small portable devices such as MP3 players have also increased the demand for circuits that can operate efficiently on a single battery cell.

Lower power supply voltages have posed a number of circuit design challenges and difficulties. One of these difficulties lies in on-chip reference voltage generation. Regardless of the particular application, most semiconductor circuits require accurate and predictable bias generation in order to guarantee acceptable circuit performance over a process, temperature and power supply voltages. Bandgap voltage references, in particular, are widely used to generate temperature independent voltages. These temperature independent voltages are then used, for example, to derive A/D thresholds, regulated power supply voltages, and temperature independent current sources. Bandgap voltages are derived by summing a diode voltage (typically between about 0.6V and 0.8V) which has an inversely proportional to temperature characteristic, to a voltage that is proportional to temperature. The resulting voltage is typically about 1.23 volts in a silicon process in order for the positive and negative temperature characteristics to cancel out. Because the resulting voltage is in the neighborhood of the 1.11 bandgap of silicon, these references are commonly referred to as bandgap references.

As supply voltages decrease to 1.6 V and below, circuits commonly used in the past to generate reliably a 1.23V temperature independent voltage are no longer feasible. Some circuits have been developed to address this issue by using voltage scaling and sampling techniques, however, many of these circuits suffer from noise, inaccuracy, low yield, and switching ripple. In the field of semiconductor circuits, what are needed are high-yielding, low voltage bandgap circuits that provide accurate, low-noise and low-ripple outputs.

SUMMARY OF THE INVENTION

In one embodiment, a circuit is disclosed. The circuit has a chopper stabilized amplifier, a network coupled in feedback with the chopper stabilized amplifier, a plurality of switches coupled to an output of the chopper stabilized amplifier; and a summing network coupled to the plurality of switches. Ones of the plurality of switches are coupled to ones of a plurality of the summing network inputs.

The foregoing has outlined, rather broadly, features of the present invention. Additional features of the invention will be described, hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of embodiments of the present invention and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of embodiments are discussed in detail below. It should be appreciated, however, that the present invention provides many applicable inventive concepts that may be embodied in a wide variety of specific contexts. The specific embodiments discussed are merely illustrative of specific ways to make and use the invention, and do not limit the scope of the invention.

The present invention will be described with respect to embodiments in a specific context, namely a system and method for generating a reference voltage. Embodiments of this invention may also be applied to other circuits and systems that require accurate and stable DC voltages.

Figure 1:
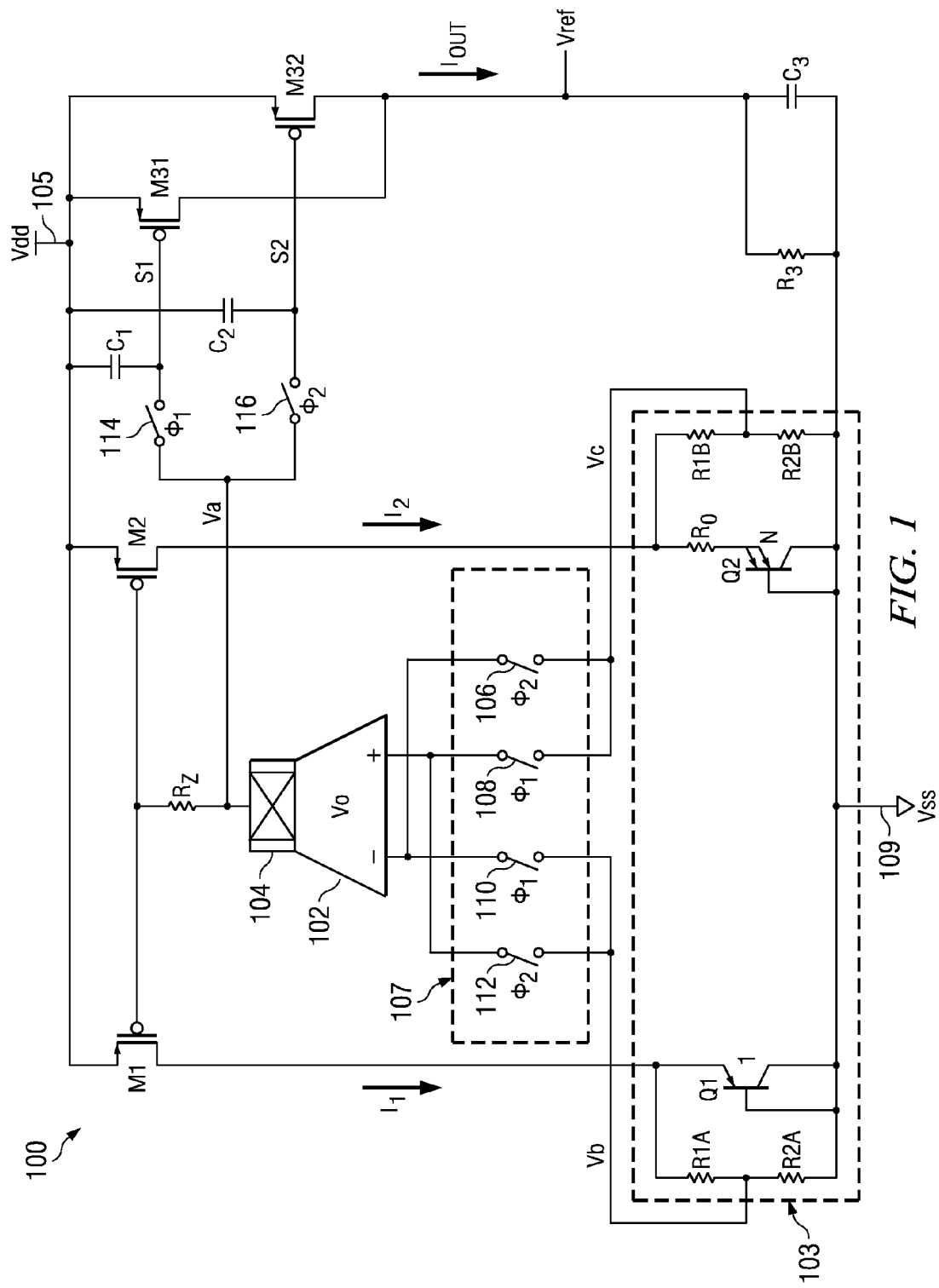
FIG. 1 illustrates a schematic of an embodiment voltage reference.

A voltage reference 100 according to an embodiment of the present invention is shown in FIG. 1. Generally, a chopper stabilized amplifier is used to bias ΔVBE circuit 103. Node Va is alternately sampled in successive clock phases φ1 and φ2 onto nodes S1 and S2, stored on capacitors $C_1$ and $C_2$ respectively, and converted to current Iout via PMOS transistors M31 and M32. The effect of any voltage differences between S1 and S2 is averaged by summing the drain currents of M31 and M32 resulting in a temperature stable, low-ripple output on node Vref.

More specifically, voltage reference 100 has an amplifier 102 with switches 106, 108, 110 and 112 at its input and mixer 104 at its output forming a chopper stabilized amplification system. Amplifier 102 is preferably a transconductance amplifier, although in alternative embodiments of the present invention, other amplifier types may be used. Amplifier 102 is coupled to PMOS transistors M1 and M2 which supply currents to ΔVBE circuit 103. In alternative embodiments of the present invention, PMOS transistors may be implemented using other current source structures, for example cascode current sources or current source structures utilizing local feedback. In other embodiments, transistors M1 and M2 can be implemented using other MOS transistor types such as NMOS devices, or even BJT devices such as PNP or NPN devices.

ΔVBE circuit 103 has PNP transistor Q1 in parallel to a series combination of resistors $R_{1A}$ and $R_{1B}$ in a first branch, and PNP transistor Q2 in series with resistor R0, the combination in parallel to a series combination of resistors $R_{1B}$ and $R_{2B}$ in a second branch. The area of Q2 is N times the area of Q1, where N is preferably 7, however, N can take on other values in alternative embodiments of the present invention. Q1 and Q2 are preferably implemented using parasitic substrate PNP structures for compatibility with standard CMOS processes. Using substrate PNP structures is advantageous because both the base and collector of PNP devices Q1 and Q2 are connected to ground, however, other structures such as NPNs, diodes, or other devices containing a semiconductor junction can be used in place of Q1 and Q2 if available in the process. In alternative embodiments of the present invention, transistors M1 and M2 can be coupled to VSS 107 and reference branch 103 can be coupled to Vdd 105. In further alternative embodiments of the present invention, other ΔVBE circuit architectures can be used in place of ΔVBE circuit 103 shown in FIG. 1.

The output of amplifier 102 is further coupled to switches 114 and 116 which sample the voltage at node Va onto capacitors $C_1$ and $C_2$. The gates of PMOS current source transistors M31 and M32 are coupled to capacitors $C_1$ and $C_2$. In alternative embodiments of the present invention, $C_1$ and $C_2$ can be omitted if the gate-source capacitance of M31 and M32 are large enough to reliably store voltage Va. In order to provide a sum of currents, the drains of devices M31 and M32 are coupled together so that current Iout flows from the drains of devices M31 and M32 across resistor R3.

Optional filter capacitor C3 provides a pole at the output which helps to reduce ripple on Vref. In alternative embodiments of the present invention, PMOS transistors M31 and M32 can be replaced by another kind of current source, for example, a cascode current source, or another transistor type such as a PNP transistor. M31 and M32, however, are preferably of the same device type and/or architecture as devices M1 and M2 to provide accurate current mirroring. In further embodiments of the present invention, devices M31 and M32 may be scaled versions of M1 and M2. M31 and M32 are preferably matched to M1 and M2 using techniques known in the art in order to enhance accuracy of voltage reference 100. Optional resistor Rz can be coupled between amplifier 102 and the gates of M1 and M2 to further improve performance, as will be described hereinbelow.

The DC operation of voltage reference 100 can be derived if an analysis is performed under the assumption that switches 110, 108, 114 and 116 are closed and switches 106 and 112 are open. The feedback operation of amplifier 102 adjusts the magnitude of currents $I_1$ and $I_2$ until the voltages VB and VC are substantially equal. It can be shown that $$I_1 = I_2 = \frac{1}{R_o}\left[v_T \ln(N) + \frac{R_o}{R_1 + R_2} V_{BE1}\right], \quad (1)$$

where $v_T$ is the thermal voltage, N is the area ratio of Q1 to Q2, $V_{BE1}$ is the base-emitter voltage of Q1, and $I_1$, $I_2$, $R_o$, and $R_2$ are as noted in FIG. 1. Because the thermal voltage, $v_T$, is proportional to temperature and $V_{BE1}$ is decreasing with temperature, currents $I_1$ and $I_2$ have both increasing and decreasing temperature components. In preferred embodiments of the present invention, the circuit topology is optimized so that the proportional to temperature term, $v_T \ln(N)$, cancels out the decreasing temperature term, $$\frac{R_o}{R_2} V_{BE1},$$

thereby making the sum, $$\left[v_T \ln(N) + \frac{R_o}{R_1 + R_2} V_{BE1}\right],$$

constant over temperature. It should also be noted that in practical applications, currents $I_1$ and $I_2$ would have an additional temperature coefficient equivalent to the temperature coefficient or $R_o$, $R_1$ and $R_2$. This temperature coefficient can be eliminated if $R_3$ is made from the same material and has the same temperature coefficient as $R_o$, $R_1$ and $R_2$.

Assuming that switches 114 and 116 are closed for the purposes of analysis, and assuming that the combined device areas of M31 and M32 are equal to one of M1 or M2, an expression for DC voltage Vref can be found to be $$Vref = \frac{R_3}{R_o}\left[v_T \ln(N) + \frac{R_o}{R_1 + R_2} V_{BE1}\right], \quad (2)$$

where Vref and $R_3$ are as noted on the schematic. It can be seen from Equation 2 that Vref can be adjusted by modifying the value of resistor $R_3$ or by changing the mirroring ratio between mirror devices M1/M2 and M31/M32. By manipulating these values, a range of possible temperature independent voltages can be provided from Vss to within a few hundred millivolts of Vdd. The accuracy and performance of voltage reference 100 degrades as Vref approaches Vdd and devices M31 and M32 leave saturation and operate in the linear region.

Operating voltage reference 100 as a strictly DC circuit, as described in the DC analysis presented hereinabove, poses some difficulties. Both statistical and systematic offsets of amplifier 112 can lead to errors in the output voltage. Potential offsets are further amplified, which exacerbates the effect of the voltage dividers formed by $R_{1A}$ and $R_{2A}$ and by $R_{1A}$ and $R_{1B}$. As the voltage divider ratio increases, voltage gain from the input of amplifier to Vref increases. For example, if the gain from the input to amplifier 102 to Vref is about 20, and if amplifier 102 has an input referred offset of about 10 mV, a 200 mV voltage error would occur at output node Vref, if Vref were adjusted to 1.23V by $R_3$. Such an error is unacceptable in many applications.

Problems stemming from offset can be addressed by operating amplifier 102 as a chopper stabilized amplifier. A chopper stabilized amplifier is made up of an input mixer 107, followed by amplifier 102, and output mixer 104. Input mixer 107 is made of switches 106, 108, 110 and 112 that periodically reverses the polarity of the input of amplifier 102. In preferred embodiments of the present invention, this reversal of polarity preferably occurs at a switching frequency of between about 50 kHz and about 10 MHz, preferably 250 kHz. In alternative embodiments, however, other frequencies may be used depending on the application. First mixer 107 essentially mixes the DC components at the input of the mixer to twice the switching frequency. Amplifier 102 amplifies the output of the first mixer, and output mixer 104 mixes the original DC component located at twice the switching frequency back down to DC. Any offset present within the amplifier is essentially canceled out by the mixing action of mixers 107 and 104.

Another way to view the canceling effect of the chopper stabilized amplifier is to consider what occurs at node Va during each switching interval. The DC output of amplifier 102 during φ1 can be represented as $V_{Desired}+\Delta V$, where $V_{Desired}$ is the desired output voltage and $\Delta V$ is the error voltage due to offset. During φ2, however, the polarity of amplifier 102 is reversed yielding an output voltage of $V_{Desired}-\Delta V$. Assuming a 50% duty cycle, it can be seen that the average output voltage between φ1 and φ2 is $(V_{Desired}+\Delta V+V_{Desired}-\Delta V)/2=V_{Desired}$. The $\Delta V$ terms are effectively canceled out.

In preferred embodiments of the present invention, output mixer 104 is incorporated within amplifier 102, which will be discussed hereinbelow with respect to FIG. 2. In alternative embodiments of the present invention, a separate output mixer may be used. Switches 106, 108, 110 and 112 are preferably implemented by MOS switches, however in alternative embodiments, diodes, bipolar transistors, or other devices may be used as these switching elements.

While the use of a chopper stabilized amplifier can be used to eliminate the offset of amplifier 102, the use of a switched system, as implemented in conventional art systems, introduces other performance non-idealities due to switching transients. For example, the switching action of mixers 107 and 104 produces disturbances at node Va. As described above, output at node Vref will oscillate between $V_{Desired}+\Delta V$ and $V_{Desired}-\Delta V$, yielding a peak-to-peak disturbance of at least $2\Delta V$. In addition to disturbances caused by the output offset voltages, switching disturbances such as charge injection and other switching transients may occur. These disturbances can appear as a periodic signal of significant amplitude on output Vref and may cause a wide range of functional difficulties such as poor circuit performance and spurious emissions. Conventional art systems have attempted to deal with this issue by low pass filtering the output voltage with a very large shunt capacitor at the output or with a very large Miller capacitor in the amplifier used for low pass filtering in addition to dynamic stabilization.

Figure 4:
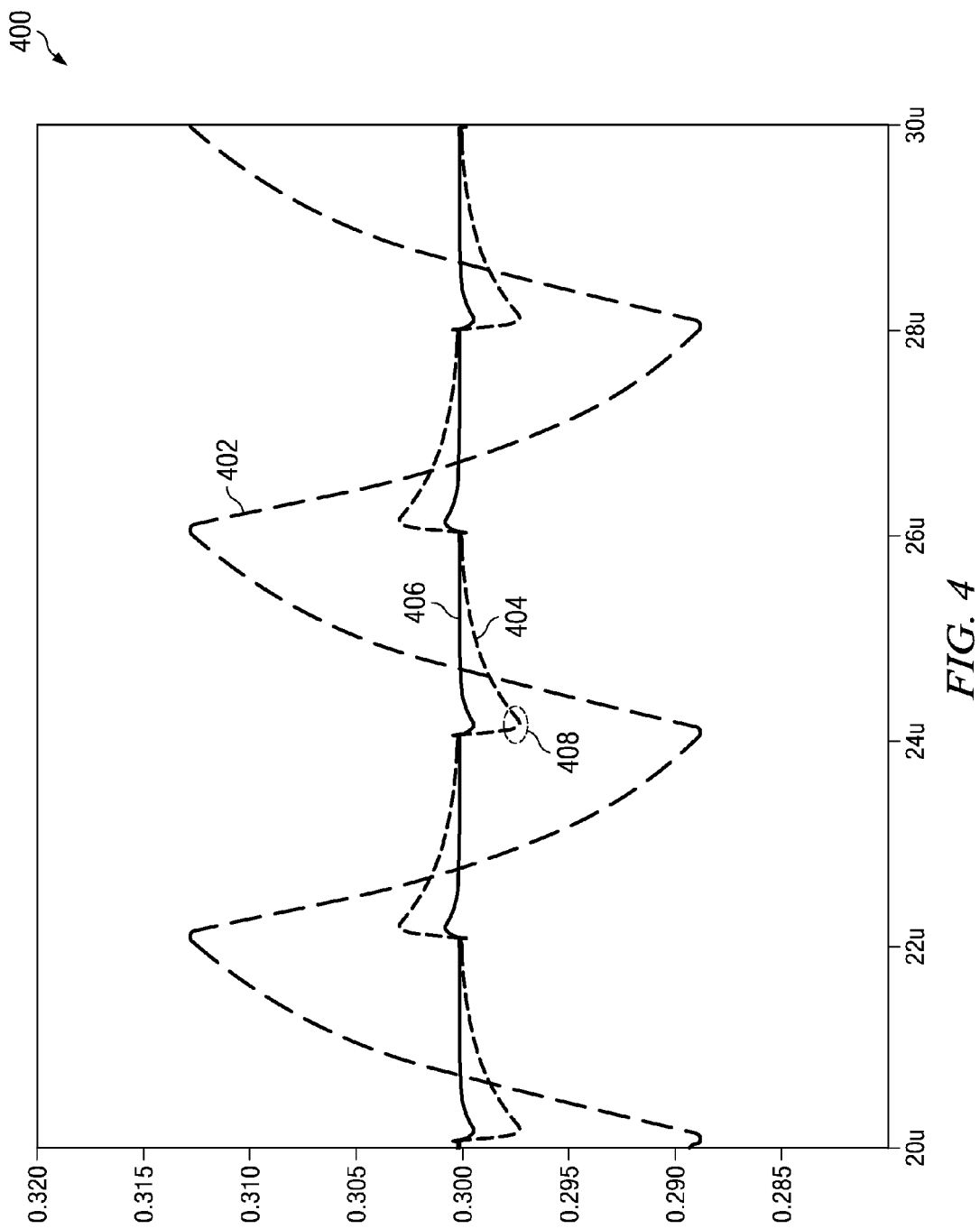
FIG. 4 illustrates a waveform comparison of conventional and embodiment voltage reference circuits.

Curve 402 shown in FIG. 4 is an example output waveform of a conventional art capacitively loaded chopper stabilized voltage reference. It can be seen that the average voltage of the output is about 300 mV, however the signal itself experiences excursions between 288 mV and 312 mV. Embodiments of the present invention address this problem by successively sampling the output of amplifier 102 by switches 114 and 116, storing the voltage during φ1 and φ2 on capacitors $C_1$ and $C_2$ respectively, and using each of the sampled voltages to control current mirror transistors M31 and M32. At the same time, the output of amplifier 102 controls $\Delta V_{BE}$ circuit 103 through current source transistors M1 and M2. In embodiments of the present invention, $C_1$ may store the voltage $V_{Desired}+\Delta V$ and $C_2$ may store the voltage $V_{Desired}-\Delta V$, for example. If we assume that the transconductance of transistors M31 and M32 are each gm/2, M31 will output the current $gm(V_{Desired}+\Delta V)/2$ and transistor M32 will output the current $gm(V_{Desired}-\Delta V)/2$. The total current output by the combination of M31 and M32 is therefore $gmV_{Desired}$, which is a continuous time current unaffected by transient errors caused by the offset of amplifier 102. Rather than averaging the output of the chopper stabilized amplifier 102 over time, this averaging is performed using continuous currents.

Curve 404 shown in FIG. 4 is an example of an output of an embodiment voltage reference showing considerable improvement over a conventional art chopper stabilized voltage reference. Curve 404, however, still shows evidence of switching transient disturbances, for example at point 408.

Turning back to FIG. 1, resistor Rz is coupled between the output of mixer 104 and the gates of current source transistors M1 and M2 in preferred embodiments of the present invention. Rz decouples the output of mixer 104 and switches 114 and 116 from the gates of current source transistors M1 and M2. $R_z$ preferably has a conductance of about equal to the transconductance of amplifier 102 and is preferably implemented as an MOS resistor. Other values and implementation methods for $R_z$ can be used in alternative embodiments.

Figure 2:
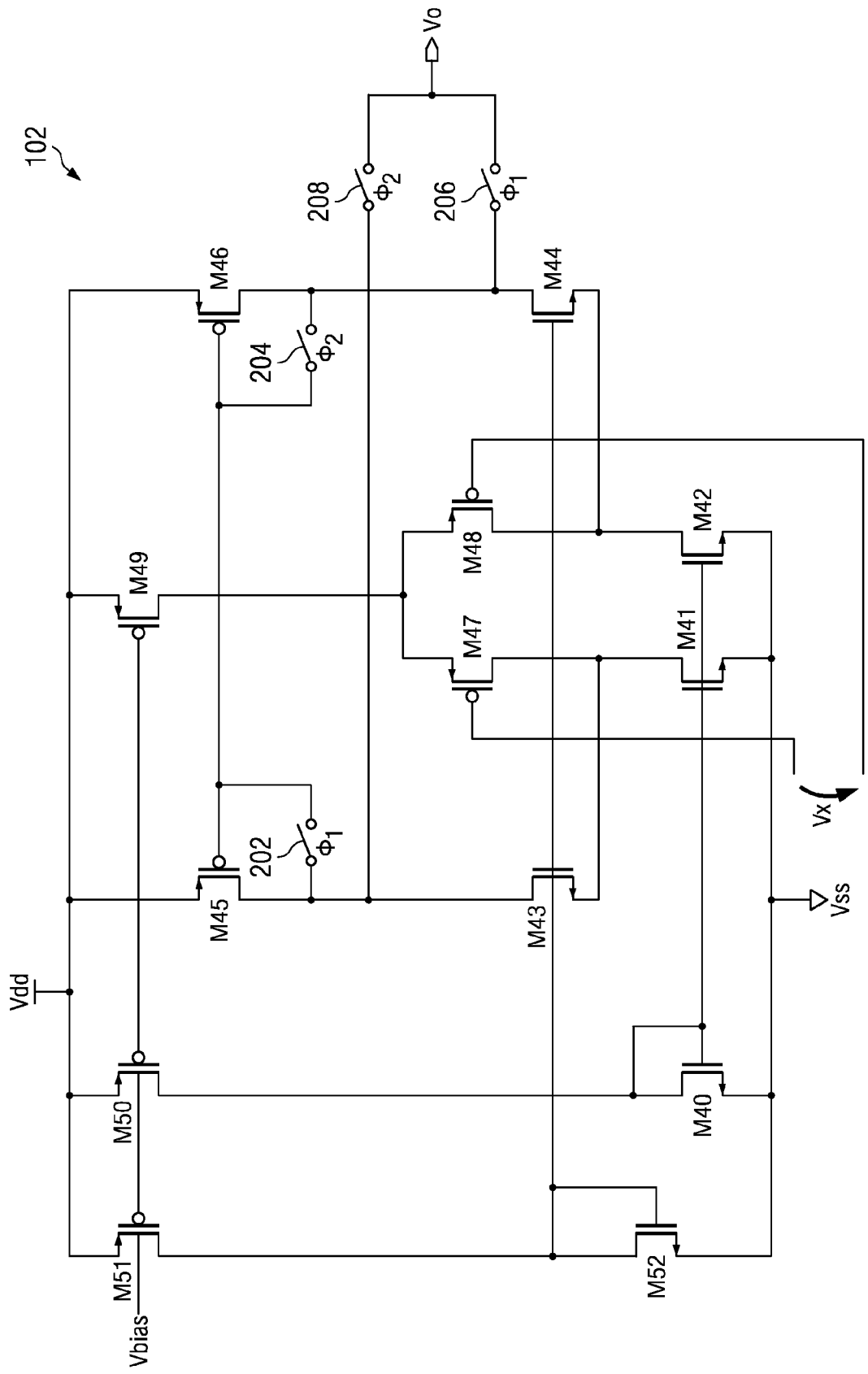
FIG. 2 illustrates a schematic of an embodiment amplifier used in the voltage reference of FIG. 1.

Turning to FIG. 2, a schematic of amplifier 102 (FIG. 1) is illustrated. In preferred embodiments of the present invention, a folded cascade amplifier 102 with a switched output is used. A differential input stage having PMOS transistors M47 and M48 is coupled to NMOS current source transistors M41 and M42 and NMOS cascode transistors M43 and M44. Tail current for the differential input stage is provided by PMOS current source transistor M49. In the present embodiment, transistors M40, M50, M51 and M52 provide bias references based off reference voltage Vbias. For example, PMOS transistor M51 and diode connected NMOS transistor M52 provide a bias reference cascode transistors M43 and M44, and PMOS transistor M50 and diode connected NMOS transistor M40 provide a bias reference for current source transistors M41 and M42. Transistor sizing and bias generation is designed according to conventional techniques, however, in low voltage applications, high swing cascode bias techniques are preferably used to bias cascade transistors M43 and M44.

A switched output stage of amplifier 102 is formed by PMOS output transistors M45 and M46 and switches 202, 204, 206, and 208. During φ1, switches 202 and 206 are closed and switches 204 and 208 are open, thereby connecting PMOS transistor M45 in a diode connected configuration and connecting Vo to the drains of NMOS transistor M44 and PMOS transistor M46. During φ1, signal current from the differential input pair is either delivered to output node Vo through cascode NMOS transistor M44, or through cascode transistor M43 and mirrored from diode connected PMOS transistor M45 to PMOS transistor M46. Likewise, during φ2, switches 204 and 208 are closed and switches 202 and 206 are open, thereby placing PMOS transistor M46 in a diode connected configuration and connecting Vo to the drains of NMOS transistor M43 and PMOS transistor M45. During φ2, signal current from the differential input pair is either delivered to the output node through cascode NMOS transistor M43, or is delivered to the output by passing through cascode transistor M44 and mirrored from diode connected PMOS transistor M46 to PMOS transistor M45. Switches 202, 204, 206 and 208 are preferably implemented using MOS transistors, however, diodes, BJT's and other devices may be used in alternative embodiments of the present invention.

In alternative embodiments of the present invention, other amplifier topologies, or variations of the illustrated topologies may be used in place of amplifier 102 shown in FIG. 2. For example, a folded cascade amplifier with an NMOS differential input pair may be used in voltage references with more available headroom, or in voltage references whose output is referenced from the supply rather than ground referenced scheme as shown in FIG. 1.

Figure 3A:
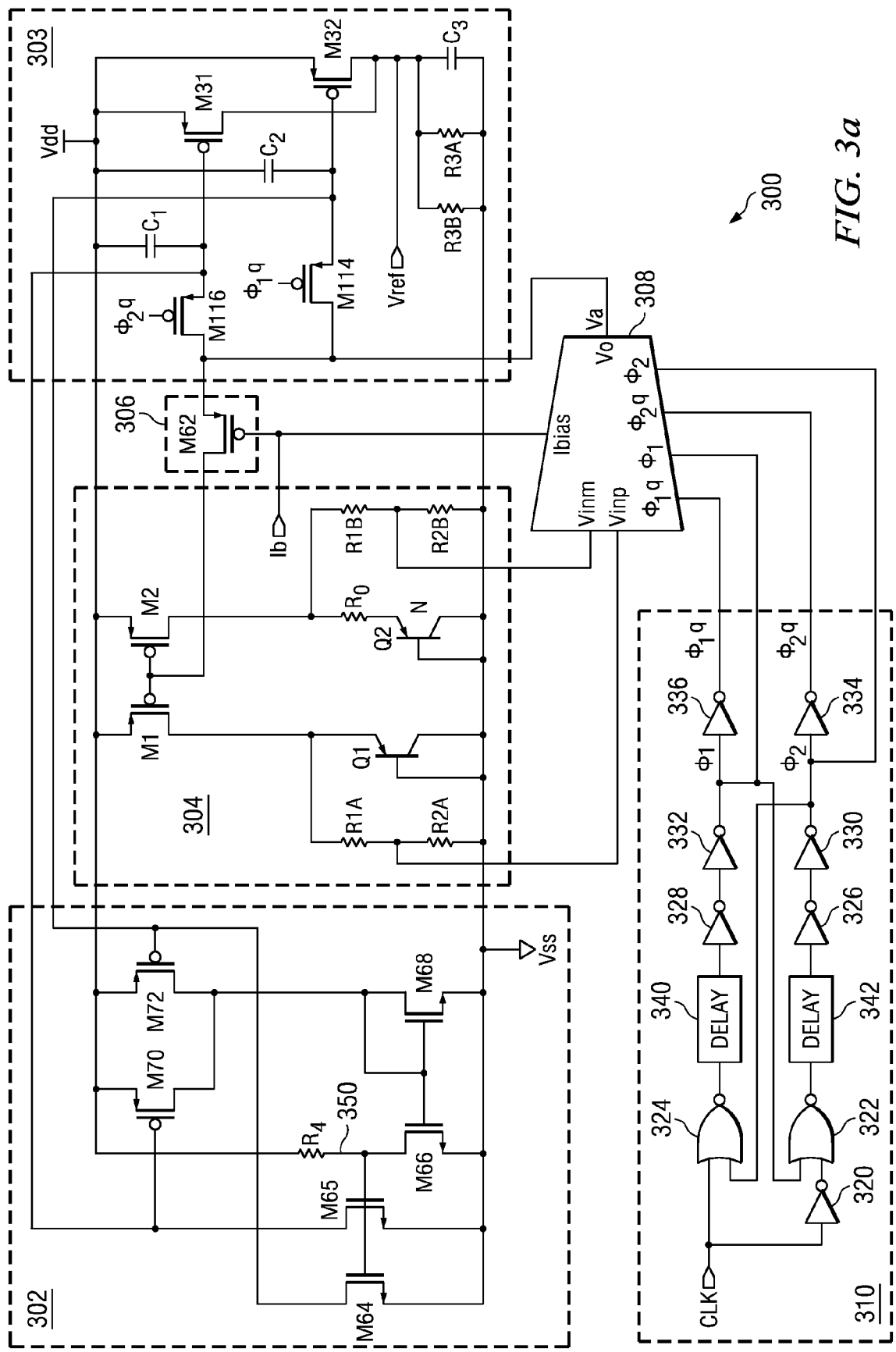
FIGS. 3a-3b illustrate another embodiment voltage reference.
Figure 3B:
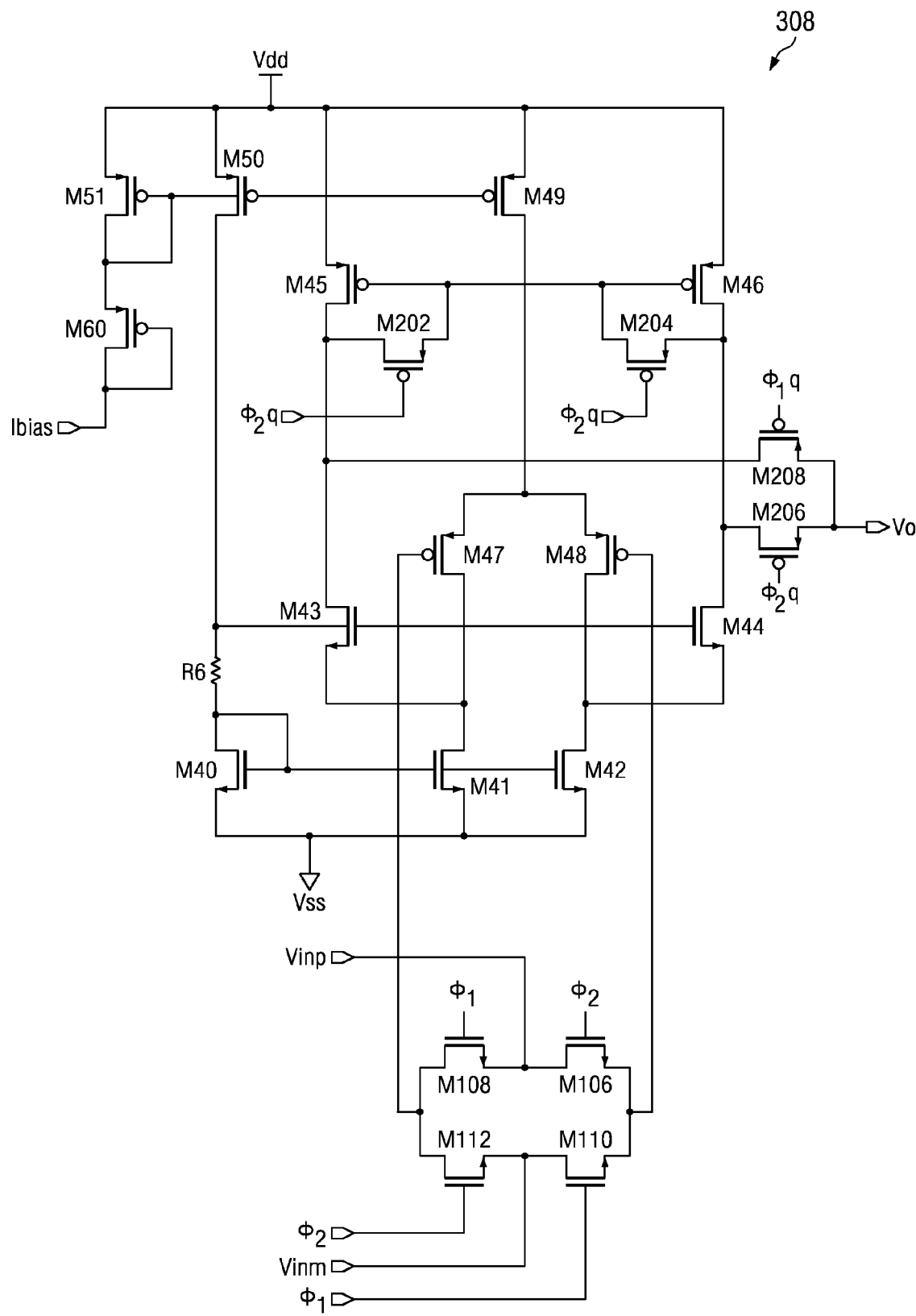

FIGS. 3a-3b illustrate schematics for another embodiment of the present invention. Voltage reference 300 has reference generation core 304, start-up circuit 302, output circuitry 303, amplifier 308, and non-overlapping clock generator 310. Detailed schematics of amplifier 308 are contained in FIG. 3b.

Reference generation core 304 has PMOS current mirror transistors M1 and M2, transistors Q1 and Q2, and resistors $R_{1A}$, $R_{2A}$, $R_{1B}$, $R_{2B}$ and $R_o$. Amplifier 308 and reference generation core 304 work together in feedback to produce voltage Va as described herein above. Output circuit 303 alternately samples Va during phases φ1 and φ2 using PMOS transistors M114 and M116 as switches and capacitors $C_1$ and $C_2$ as storage elements. Currents from PMOS transistors M1 and M2 in the reference core is mirrored to PMOS output transistors M31 and M32. PMOS transistor M62 performs the function of $R_z$ (FIG. 1) and is coupled between the output of amplifier 308 and the gates of PMOS transistors M1 and M2. As described hereinabove, M62 preferable has a conductance roughly equivalent to the transconductance of amplifier 308 under normal bias conditions.

Clock signals φ1 and φ2 are generated by non-overlapping clock generator 310 which contains NOR gates 322 and 324, inverters 320, 326, 328, 330, 332, 336 and 334 and delay elements 340 and 342. The topology of non-overlapping clock generator 310 ensures that φ1 and φ2 are never active simultaneously. For example, when Clk transitions from low to high, φ1 first transitions from high to low. φ2 cannot transition from high to low until after a transition at φ1 propagates through NOR gate 322, delay 342, and finally through inverters 326 and 330. It should be noted that signals φ1 and φ2 are active high and provide non-overlapping low periods suitably for use of driving NMOS switches. Signals φ1q and φ2q are derived from inverters 336 and 334 and provide active low signals suitable for driving PMOS switches. Delay elements 340 and 342 can be implemented using a chain of inverters, a series of weak capacitively loaded inverters, or other delay techniques known in the art. The actual delay used is selected for optimal performance. In preferred embodiments of the present invention, this delay is preferably between about 2 ns and about 10 ns. In alternative embodiments of the present invention other delays can be used. Furthermore, other techniques and architectures can be used to generate non-overlapping clocks φ1 and φ2.

Because the combination of reference core 304 and amplifier 308 may be stable in two states, start-up circuit 302 is provided to ensure that reference core starts up in a desired state. When the circuit starts up, no current flows though NMOS device M66, and node 350 is initially at Vdd. As a result, the gates of NMOS devices M64 and M65 are pulled high, which causes the gates of PMOS devices M1, M2, M31, M31, M70 and M72 to be pulled low, thereby causing current to flow in these devices. Once the gates of devices M70 and M72 are pulled low, however, current flow in M68 is mirrored to M66, which pulls node 350 low. Once node 350 is low, M64 and M65 shut off, and the start-up circuit becomes disabled.

In a preferred embodiment of the present invention, the following values are assigned for the circuit of FIG. 3a: $R_o$=6KΩ, $R_{1A}$=27KΩ, $R_{1B}$=27KΩ, $R_{2A}$=27KΩ, $R_{2B}$=27KΩ, $R_{3A}$=27KΩ, $R_{3A}$=27KΩ, $R_4$=1MΩ, and N=8. The resistance of PMOS device M62 is set to about 12 kΩ, to match the transconductance of amplifier 308, and input bias current Ib is set to about 10 μA. It should be understood that these values are optimized for a particular embodiment and may be different in alternative embodiments of the present invention.

Turning to FIG. 3b, a schematic of operational transconductance amplifier (OTA) 308 (FIG. 2) is illustrated. A differential input stage having PMOS transistors M47 and M48 is coupled to NMOS current source transistors M41 and M42 and NMOS cascode transistors M43 and M44. Tail current for the differential input stage is provided by PMOS current source transistor M49 which is mirrored off PMOS device M51. In preferred embodiments of the present invention, the tail current though M49 is preferably 20 μA, however this current may vary over process and temperature. In alternative embodiments of the present invention, a higher or lower tail current can be used. Diode connected PMOS device M60 is provided in series with PMOS mirror device in order to provide a bias voltage for transistor M62 (FIG. 3a) so that the gate of M62 is biased 2 Vgs below Vdd. Current mirror transistor M40 provides a bias reference for NMOS current source transistors M41 and M42. Cascode transistors M43 and M44 are biased by M40 and resistor R6. R6 is preferably about 36KΩ, and the current through M40 is preferably about 10 μA, however, these values can vary in alternative embodiments. Transistor sizing and bias generation is designed according to conventional techniques, however, in low voltage applications, high swing cascode bias techniques are preferably used to bias cascode transistors M43 and M44. Again, it should be noted that these values can vary according to the implementation, architecture, and embodiment. It should also be noted that other amplifier architectures besides the architecture depicted in FIG. 3b can be used, for example, other transconductance amplifier structures or voltage amplifier architectures.

NMOS input switches M106, M108, M110 and M112 are provided at the input of amplifier 308 to make up the input mixer and are operated by non-overlapping clock signals φ1 and φ2. PMOS output switches M202, M204, M206 and M208 are provided at the output of amplifier 308 and are also operated by non-overlapping clock signals φ1q and φ2q. Operation of these switches is described hereinabove with respect to the embodiments of FIG. 1 and FIG. 2. In alternative embodiments of the present invention, the implementation of amplifier 308 may differ from the schematic shown in FIG. 3b. For example, an alternative embodiment amplifier may have an NMOS differential input and/or PMOS transistors may be used in place of NMOS transistors and vice versa. Furthermore, alternative semiconductor processes, such as BiCMOS process may be used, in which case Bipolar transistors may be substituted for some or all of the MOS devices in the embodiments shown in FIGS. 3a-3b.

It will also be readily understood by those skilled in the art that materials and methods may be varied while remaining within the scope of the present invention. It is also appreciated that the present invention provides many applicable inventive concepts other than the specific contexts used to illustrate embodiments. Accordingly, the appended claims are intended to include within their scope such processes, machines, manufacture, compositions of matter, means, methods, or steps.

What is claimed is:

1. A circuit comprising:
a chopper stabilized amplifier;
a network coupled in feedback with the chopper stabilized amplifier;
a plurality of switches coupled to an output of the chopper stabilized amplifier; and
a summing network coupled to the plurality of switches, wherein ones of the plurality of switches are coupled to ones of a plurality of the summing network inputs.

2. The circuit of claim 1, wherein the summing network comprises a plurality of amplifying devices, wherein ones of inputs of the plurality of amplifying devices are coupled to ones of the plurality of switches.

3. The circuit of claim 2 wherein an output of the summing network comprises:
   a signal component proportional to absolute temperature; and
   a signal component inversely proportional to absolute temperature.

4. The circuit of claim 2, wherein
   the plurality of amplifying devices comprise transconductance amplifiers; and
   an output of the summing network comprises a current.

5. The circuit of claim 4, further comprising a resistor coupled to the output of the summing network.

6. The circuit of claim 5, wherein a voltage formed across the resistor is substantially independent of temperature.

7. The circuit of claim 1, wherein the chopper stabilized amplifier comprises:
   an input mixer coupled to an input of a transconductance amplifier; and
   an output mixer coupled to an output of the transconductance amplifier.

8. The circuit of claim 7, further comprising a resistor coupled between an output of the chopper stabilized amplifier and the network coupled in feedback.

9. The circuit of claim 8, wherein the resistor comprises a conductance approximately equal to a transconductance of the transconductance amplifier.

10. A semiconductor bandgap circuit comprising:
    a plurality of circuit networks, each network comprising a diode;
    a chopper stabilized amplifier, wherein each input of the chopper stabilized amplifier is coupled to each of the plurality of circuit networks;
    a plurality of current source transistors, wherein a control node of each current source transistor is coupled to an output of the chopper stabilized amplifier, and wherein a current output of each current source transistor is coupled to each of the plurality of circuit networks;
    a plurality of sampling switches coupled to the output of the chopper stabilized amplifier; and
    a plurality of further current source transistors, wherein control gates of ones of the plurality of the further current source transistors are coupled to the output of the chopper stabilized amplifier.

11. The semiconductor bandgap circuit of claim 10, wherein
    at least one of the plurality of circuit networks comprise resistors; and
    an area of a diode of at least one of the plurality of circuit networks is larger than an area of a diode in another one of the plurality of circuit networks.

12. The semiconductor bandgap circuit of claim 11, wherein the diodes comprise bipolar junction transistors.

13. The semiconductor bandgap circuit of claim 11, further comprising a resistor coupled between the chopper stabilized amplifier and the plurality of sampling switches.

14. The semiconductor bandgap circuit of claim 11, wherein the sampling switches comprise MOS transistors.

15. A voltage reference circuit comprising
    a chopper stabilized amplifier comprising
        a first input coupled to an output of a first reference generator, and
        second input coupled to an output of a second reference generator;
    a first current source comprising
        a control input coupled to the output of the chopper stabilized amplifier, and
        a current output coupled to an input of the first reference generator;
    a second current source comprising
        a control input coupled to the output of the chopper stabilized amplifier, and
        a current output coupled an input of the second reference generator;
    a first switch coupled between a control input of a third current source and the output of the chopper stabilized amplifier; and
    a second switch coupled between a control input of a fourth current source and the output of the chopper stabilized amplifier, wherein a current output of the third current source is coupled to a current output of the fourth current source.

16. The voltage reference circuit of claim 15, further comprising an output series resistor coupled between the output of the chopper stabilized amplifier and the control input of the first current source and the second current source.

17. The voltage reference circuit of claim 16, wherein a conductance of the output series resistor comprises a value between about 50% and about 150% of a transconductance of the chopper stabilized amplifier.

18. The voltage reference circuit of claim 15, wherein the first, second, third and fourth current sources, and the switches comprise transistors.

19. The voltage reference circuit of claim 18, wherein the transistors comprise MOS transistors.

20. The voltage reference circuit of claim 15, further comprising capacitors coupled in shunt with the control inputs of the third and fourth current sources.

21. The voltage reference circuit of claim 15, further comprising a resistor coupled to the current outputs of the third and fourth current sources.

22. The voltage reference of claim 15, wherein
    the first reference generator comprises a first diode, and a first voltage divider coupled in parallel with the first diode;
    the output of the first reference generator comprises an output of the first voltage divider;
    the input of the first reference generator comprises an input of the first voltage divider;
    the second reference generator comprises a second diode, a resistor in series with the second diode, and a second voltage divider coupled in parallel to a series combination of the second diode and the resistor in series with the second diode, wherein the second diode comprises an area greater than the first diode;
    the output of the second reference generator comprises an output of the second voltage divider; and
    the input of the second reference generator comprises an input of the second voltage divider.

23. A method of generating a temperature compensated signal, the method comprising:
    controlling a plurality of temperature dependent signals with a control signal;
    mixing the plurality of temperature dependent signals to form a first signal at a non-zero frequency;
    amplifying the first signal at the non-zero frequency to form a first amplified signal;
    mixing the first amplified signal to about zero frequency to form the control signal;
    sampling the DC control signal during a first sampling interval to form a first sampled signal;

sampling the DC control signal during a second sampling to form a second sampled signal, wherein the first sampling interval is different from the second sampling interval; and forming an output signal from the first and second sampled signals.

24. The method of claim 23, wherein forming the output signal comprises converting the first and second sampled signals to first and second output currents; and forming an output voltage, wherein the forming comprises applying the first and second output currents across a resistor.

25. The method of claim 23, wherein:

amplifying comprises amplifying the first signal with a transconductance amplifier;

controlling the plurality of temperature dependent signals comprises applying the control signal to reference signal generator via a coupling resistor; and the coupling resistor comprises a conductance within about 50% and about 150% of a transconductance of the transconductance amplifier.

* * * * *